United States Patent
Ohsaki

(10) Patent No.: US 6,202,492 B1
(45) Date of Patent: Mar. 20, 2001

(54) ANTI-VIBRATION APPARATUS AND EXPOSURE APPARATUS

(75) Inventor: Tatsuya Ohsaki, Tokyo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/427,185

(22) Filed: Oct. 26, 1999

Related U.S. Application Data

(63) Continuation of application No. 08/832,220, filed on Apr. 3, 1997, now abandoned.

(30) Foreign Application Priority Data

Apr. 5, 1996 (JP) .................................................. 8-110280
Mar. 11, 1997 (JP) .................................................. 9-074590

(51) Int. Cl.$^7$ ............................ G03B 27/42; F16M 13/00
(52) U.S. Cl. ............................... 73/662; 248/550; 248/638
(58) Field of Search ............................... 73/662, 663, 664, 73/665; 248/550, 563, 562, 636, 638, 188.2

(56) References Cited

U.S. PATENT DOCUMENTS

| | | | |
|---|---|---|---|
| 3,578,278 | * 5/1971 | Pickering et al. | 248/550 |
| 4,730,541 | * 3/1988 | Greene | 248/550 |
| 4,796,873 | 1/1989 | Schubert . | |
| 4,821,205 | 4/1989 | Schutten et al. . | |
| 5,060,519 | * 10/1991 | Chojitani et al. | 248/550 |
| 5,121,898 | * 6/1992 | Yasuda et al. | 248/550 |
| 5,187,519 | * 2/1993 | Takabayashi et al. | 355/53 |
| 5,285,995 | * 2/1994 | Gonzalez et al. | 248/550 |
| 5,356,110 | * 10/1994 | Eddy | 248/550 |
| 5,374,025 | * 12/1994 | Whelpley et al. | 248/550 |
| 5,693,990 | * 12/1997 | Miyazaki | 248/550 |
| 5,811,821 | * 9/1998 | Alexander et al. | 248/550 |
| 5,812,420 | * 9/1998 | Takahashi | 248/550 |

* cited by examiner

*Primary Examiner*—Hezron Williams
*Assistant Examiner*—Rose M. Miller
(74) *Attorney, Agent, or Firm*—Armstrong, Westerman, Hattori, McLeland & Naughton

(57) ABSTRACT

As a stage moves, an anti-vibration bed of an exposure main system (40) is inclined and caused to vibrate due to the shift of the center of gravity. According to the amount of inclination of the anti-vibration bed, a decoupling calculating unit (56) changes a position control gain and controls the flow rate of air supplied to vibration-isolating pads (4A to 4D) through an air pressure control unit (37). At almost the same time as the above air flow control is effected, a control unit (11) controls actuators (7 and 32) so as to suppress vibrations on the basis of the outputs of six displacement sensors (10) and six vibration sensors (5). Accordingly, as the whole or a part of the inclination of the anti-vibration bed can be corrected by the vibration-isolating pads, it is possible to correspondingly reduce the thrust to be generated from the actuators. Thus, the generation of heat from the actuators is favorably suppressed. In other words, the disturbance vibration suppressing effect is maintained without being affected by the shift of the gravity center of the exposure main system caused by the stage movement, and moreover, environmental temperature variations are suppressed.

14 Claims, 10 Drawing Sheets

ANTI-VIBRATION APPARATUS AND EXPOSURE APPARATUS

This application is a continuation of prior application Ser. No. 08/832,220 filed Apr. 3, 1997 now abandoned.

BACKGROUND OF THE INVENTION

The present invention relates to an anti-vibration apparatus and an exposure apparatus. More particularly, the present invention is suitably applied to an active type anti-vibration apparatus wherein an anti-vibration bed is driven by an actuator so that vibrations of the anti-vibration bed are suppressed. The present invention is also suitably applied to an exposure apparatus having the anti-vibration apparatus.

With the achievement of high accuracies of precision apparatus, such as step-and-repeat reduction projection type exposure apparatuses, i.e. steppers, there has occurred a need of controlling, on the micro-G level, microvibrations acting on a base plate (anti-vibration bed) from a floor where a stepper, or the like, is installed.

Various vibration-isolating pads are used to support an anti-vibration bed: For example, mechanical dampers having a compression coil spring placed in a damping fluid, and pneumatic dampers. The vibration-isolating pads per se, have a certain degree of centering function.

In particular, pneumatic spring type anti-vibration apparatuses having pneumatic dampers enable the spring constant to be set at a small value and are capable of suppressing vibrations of about 10 Hz or more. Therefore, this type of anti-vibration apparatus has widely been employed to support precision apparatus.

Recently, active type anti-vibration apparatuses have been proposed to move beyond the limitations of conventional passive type anti-vibration apparatuses. In the active type, vibrations of an anti-vibration bed are detected with a sensor, and an actuator is driven on the basis of the output of the sensor, thereby effecting vibration control. Thus, it is possible to provide an ideal vibration-isolating effect having no resonance peak in a low-frequency control band.

In an exposure apparatus, e.g. a stepper, an XY-stage (wafer stage), which is accelerated and decelerated to a considerable extent, is mounted on a base plate held by vibration-isolating pads. Therefore, the center of gravity of the exposure apparatus main body shifts at the same time as the XY-stage moves. When the center of gravity of the exposure apparatus main body has shifted in accordance with the stage movement, an active type anti-vibration apparatus provided in the exposure apparatus effects positioning of the XY-stage with respect to the initial position by a position control loop. As the amount of movement of the stage increases, the amount of change of the gravity center of the exposure apparatus main body also increases. Consequently, the base plate, on which the exposure apparatus main body is mounted, also inclines to a considerable extent. As the amount of change of the gravity center of the exposure apparatus main body increases, the amount of inclination of the base plate also increases, and the thrust required for the actuator to correct the inclination also increases.

In such an anti-vibration apparatus, a large amount of heat is generated from the actuator, and there is a large change in the temperature of an environment where the exposure apparatus is placed. The environmental temperature change affects the measuring accuracy of a laser interferometer that measures the position of the XY-stage, giving rise to a problem, such as degradation of the stage positioning accuracy.

To solve such a problem, it is conceivable to increase the gain of the position control loop of the anti-vibration apparatus. By doing so, the position control responsivity is improved, but the vibration-isolating performance is degraded because vibrations of the floor are transmitted to the exposure apparatus main body. Therefore, it is not an effective method. Accordingly, it is urgent to develop an apparatus capable of suppressing an environmental temperature change while ensuring the position control responsivity to a certain extent without degrading the vibration-isolating performance.

SUMMARY OF THE INVENTION

An object of the present invention is to provide an anti-vibration apparatus capable of efficiently suppressing vibrations.

Another object of the present invention is to provide an anti-vibration apparatus capable of efficiently suppressing disturbance vibrations even when the center of gravity of an apparatus mounted on an anti-vibration bed shifts.

Still another object of the present invention is to provide an anti-vibration apparatus capable of suppressing the generation of heat from an actuator.

A further object of the present invention is to provide an exposure apparatus capable of efficient vibration control independently of the movement of a stage mounted on a base plate.

A still further object of the present invention is to provide an exposure apparatus capable of efficient vibration control without affecting the environmental temperature.

A still further object of the present invention is to provide an exposure apparatus capable of improving the exposure accuracy.

To attain the above-described objects, the present invention provides an anti-vibration apparatus which has an anti-vibration bed (6) held horizontally through at least three pneumatic vibration-isolating pads (4A to 4D); a plurality of actuators (7A to 7D; 32A to 32C) that drive the anti-vibration bed vertically at different positions; displacement sensors (10A to 10C) that detect a displacement of the anti-vibration bed; vibration sensors (5x to 5z) that detect vibrations of the anti-vibration bed; a first control system (11) that controls each of the actuators to suppress the vibrations of the anti-vibration bed on the basis of the outputs of the displacement and vibration sensors; and a second control system (37) that controls the flow rate of air supplied to the vibration-isolating pads according to the amount of inclination of the anti-vibration bed.

By virtue of the above arrangement, the flow rate of air is controlled according to the amount of inclination of the anti-vibration bed. Accordingly, the whole or a part of the inclination of the anti-vibration bed can be corrected by the vibration-isolating pads; therefore, it is possible to correspondingly reduce the thrust to be generated from the actuators. Thus, the generation of heat from the actuators is favorably suppressed.

To attain the above-described objects, the present invention also provides an anti-vibration apparatus which has an anti-vibration bed (6) held horizontally through at least three pneumatic vibration-isolating pads (4A to 4D); a plurality of actuators (7A to 7D; 32A to 32C) that drive the anti-vibration bed vertically at different positions; displacement sensors (10A to 10C) that detect a displacement of the anti-vibration bed; vibration sensors (5x to 5z) that detect vibrations of the anti-vibration bed; a first control system

(11) that controls each of the actuators to suppress the vibrations of the anti-vibration bed on the basis of the outputs of the displacement and vibration sensors; a second control system (37) having air controllers (37A to 37C) for controlling the flow rate of air supplied to the vibration-isolating pads, thereby correcting an inclination of the anti-vibration bed; and buffer tanks (109A to 109D) provided between the vibration-isolating pads and the air controllers.

By virtue of the above arrangement, the flow rate of air supplied to the vibration-isolating pads is controlled through the air controllers so that an inclination of the anti-vibration bed is corrected. During this control, air flows into the buffer tanks from the air controllers, and thereafter the air is supplied to the vibration-isolating pads. Therefore, a rapid change of the pressure in the vibration-isolating pads is suppressed by the action of the buffer tanks. Accordingly, it is possible to prevent the occurrence of a hop, or other similar undesired phenomenon, on a stage mounted on the anti-vibration bed, for example.

To attain the above-described objects, the present invention also provides an exposure apparatus which has an anti-vibration bed held horizontally through at least three pneumatic vibration-isolating pads; an exposure system disposed on the anti-vibration bed to transfer a pattern on a mask onto a substrate; a plurality of actuators that drive the anti-vibration bed vertically at different positions; a displacement sensor that detects a displacement of the anti-vibration bed; a vibration sensor that detects vibrations of the anti-vibration bed; a first control system that controls each of the actuators to suppress the vibrations of the anti-vibration bed on the basis of the outputs of the displacement and vibration sensors; and a second control system that controls the flow rate of air supplied to the vibration-isolating pads according to the amount of inclination of the anti-vibration bed, such inclination being caused by the shift of the center of gravity of the exposure system.

By virtue of the above arrangement, even if the center of gravity of the exposure system is shifted by the movement of a stage, for example, the whole or a part of the inclination of the anti-vibration bed can be corrected by the vibration-isolating pads, and it is possible to correspondingly reduce the thrust to be generated from the actuators. Thus, the generation of heat from the actuators is favorably suppressed.

To attain the above-described objects, the present invention also provides an exposure apparatus which has an anti-vibration bed held substantially horizontally through a pneumatic vibration-isolating pad; a stage that holds a substrate onto which a pattern on a mask is to be transferred, the stage being movable over the anti-vibration bed, with the substrate held thereon; and a control system that controls the flow rate of air supplied to the vibration-isolating pad according to the position of the stage.

By virtue of the above arrangement, an inclination of the anti-vibration bed caused by the movement of the stage can be corrected by the vibration-isolating pad. Therefore, it is possible to improve the exposure accuracy when the mask pattern is transferred onto the substrate.

BRIEF DESCRIPTION OF THE DRAWINGS

FIGS. 6(A), 6(B) and 6(C) are graphs showing examples of the position control response by the vibration-isolating pads according to the first embodiment, in which: FIG. 6(A) shows the response in the case of a high gain; FIG. 6(B) shows the response in the case of a low gain; and FIG. 6(C) shows the response in a case where gains are switched from high to low.

FIGS. 10(A) and 10(B) are graphs for describing advantageous effects of the exposure apparatus according to the second embodiment in comparison to the first embodiment, in which: FIG. 10(A) shows an example of the position control response by the vibration-isolating pads in the first embodiment as a comparative example; and FIG. 10(B) shows an example of the position control response by the vibration-isolating pads in the second embodiment.

DESCRIPTION OF THE PREFERRED EMBODIMENTS

Figure 1:
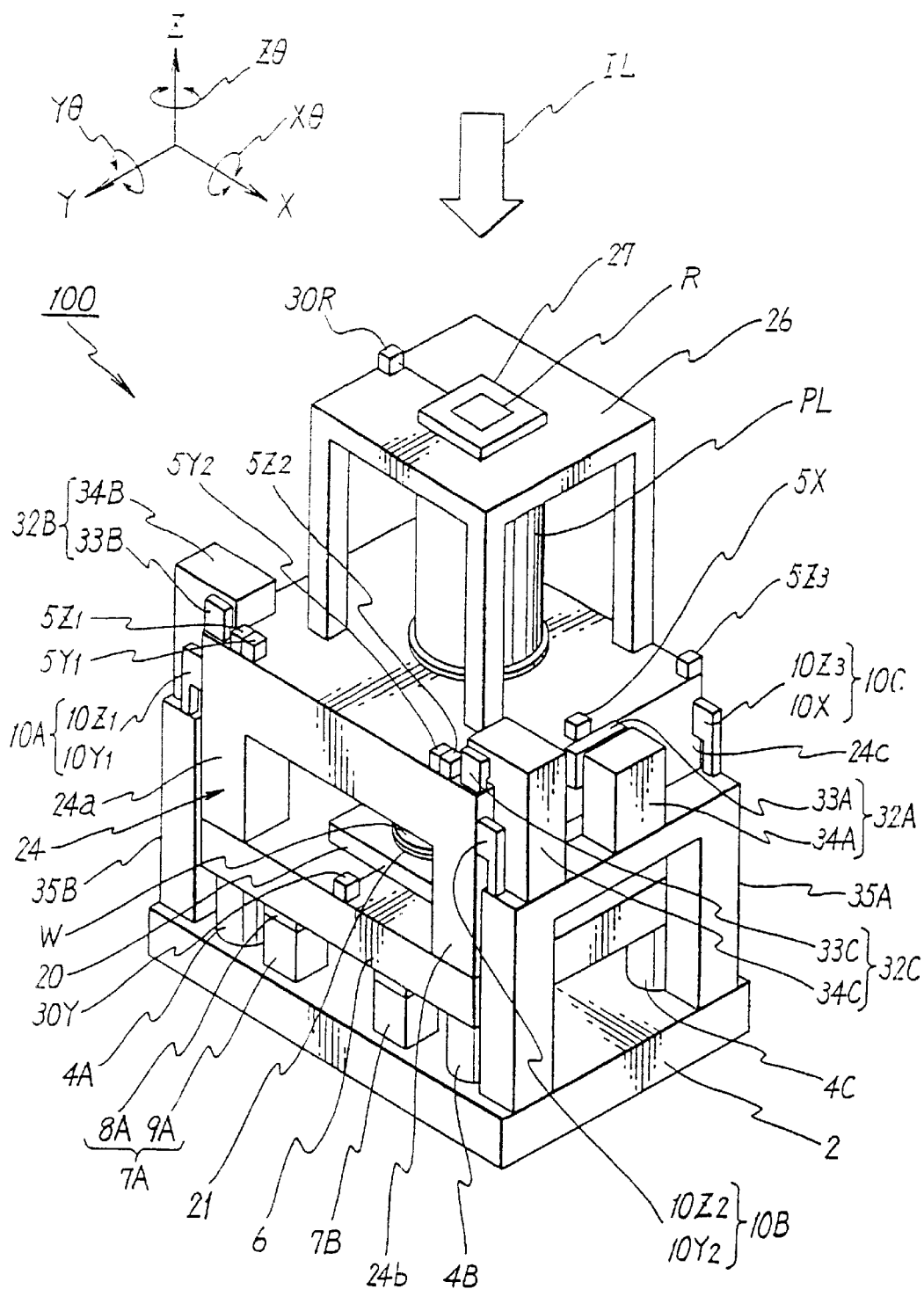
FIG. 1 is a perspective view of a projection exposure apparatus according to a first embodiment of the present invention.

First Embodiment:

A first embodiment of the present invention will be described below with reference to FIGS. 1 through 6(C). FIG. 1 is a perspective view schematically showing a step-and-scan type exposure apparatus 100 according to the first embodiment.

In FIG. 1, a rectangular plate-shaped pedestal 2 is installed on a floor as an installation surface for the exposure apparatus 100. Vibration-isolating pads 4A to 4D are installed on the pedestal 2 (the vibration-isolating pad 4D is not shown in FIG. 1; see FIG. 2). A rectangular base plate 6 as an anti-vibration bed is installed on the vibration-isolating pads 4A to 4D.

The exposure apparatus 100 according to this embodiment uses a projection optical system PL, as described later. A Z-axis is taken in a direction parallel to an optical axis of the projection optical system PL, and an X-axis is taken in the longitudinal direction of the base plate 6 in a plane perpendicular to the Z-axis. A Y-axis is taken in a direction perpendicular to both the Z- and X-axes.

Directions of rotation about the Z-, X- and Y-axes are defined as Zθ, Xθ, and Yθ, respectively. It should be noted that, in the following description, the directions indicated by the arrows representing the X-, Y- and Z-axes in FIG. 1 are defined as directions +X, +Y and +Z, and the directions opposite thereto are defined as directions −X, −Y and −Z, according to need.

Figure 2:
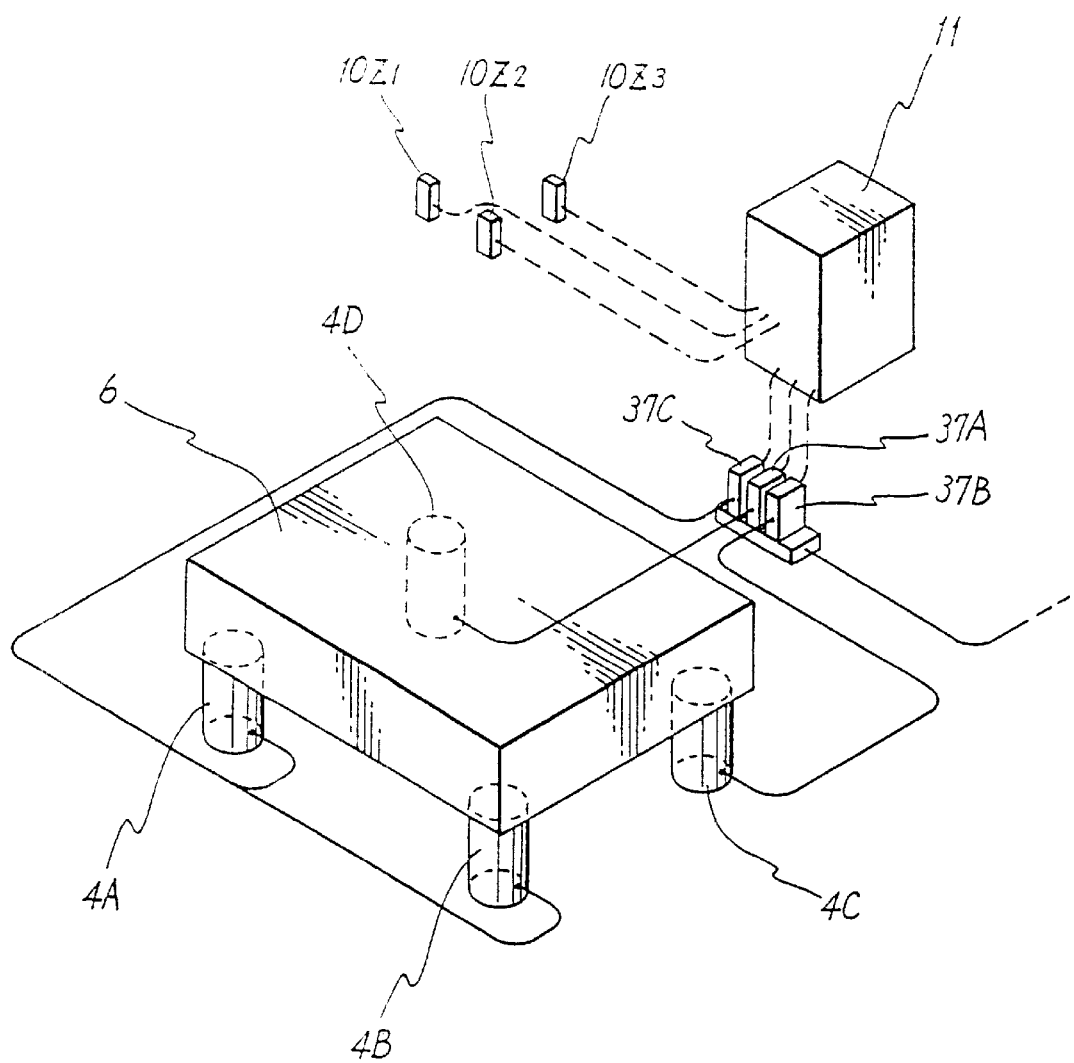
FIG. 2 is a perspective view schematically showing a system for controlling vibration-isolating pads according to the first embodiment.

As shown also in FIG. 2, the vibration-isolating pads 4A to 4D are disposed near four vertices, respectively, of the bottom of the base plate 6. In this embodiment, pneumatic dampers are used as the vibration-isolating pads 4A to 4D. As shown in FIG. 2, the vibration-isolating pads 4A to 4D are connected to a control unit 11 through three air pressure control circuits 37A, 37B and 37C. The control unit 11 controls the flow rate of air supplied to the vibration-isolating pads 4A to 4D through the air pressure control circuits 37A, 37B and 37C. In other words, the pneumatic dampers serve also as a vertically moving mechanism because the height of each of the vibration-isolating pads 4A to 4D can be adjusted by the pressure of air.

Returning to FIG. 1, an actuator 7A is installed in parallel to the vibration-isolating pad 4A between the pedestal 2 and the base plate 6. The actuator 7A comprises a stationary member 9A fixed on the pedestal 2 and a moving member 8A fixed to the bottom of the base plate 6. In response to an instruction from the control unit 11 (not shown in FIG. 1; see FIGS. 2 and 3), the actuator 7A generates an urging force acting in the direction Z from the pedestal 2 toward the base plate 6 or an attraction force acting from the bottom of the base plate 6 toward the pedestal 2.

Figure 3:
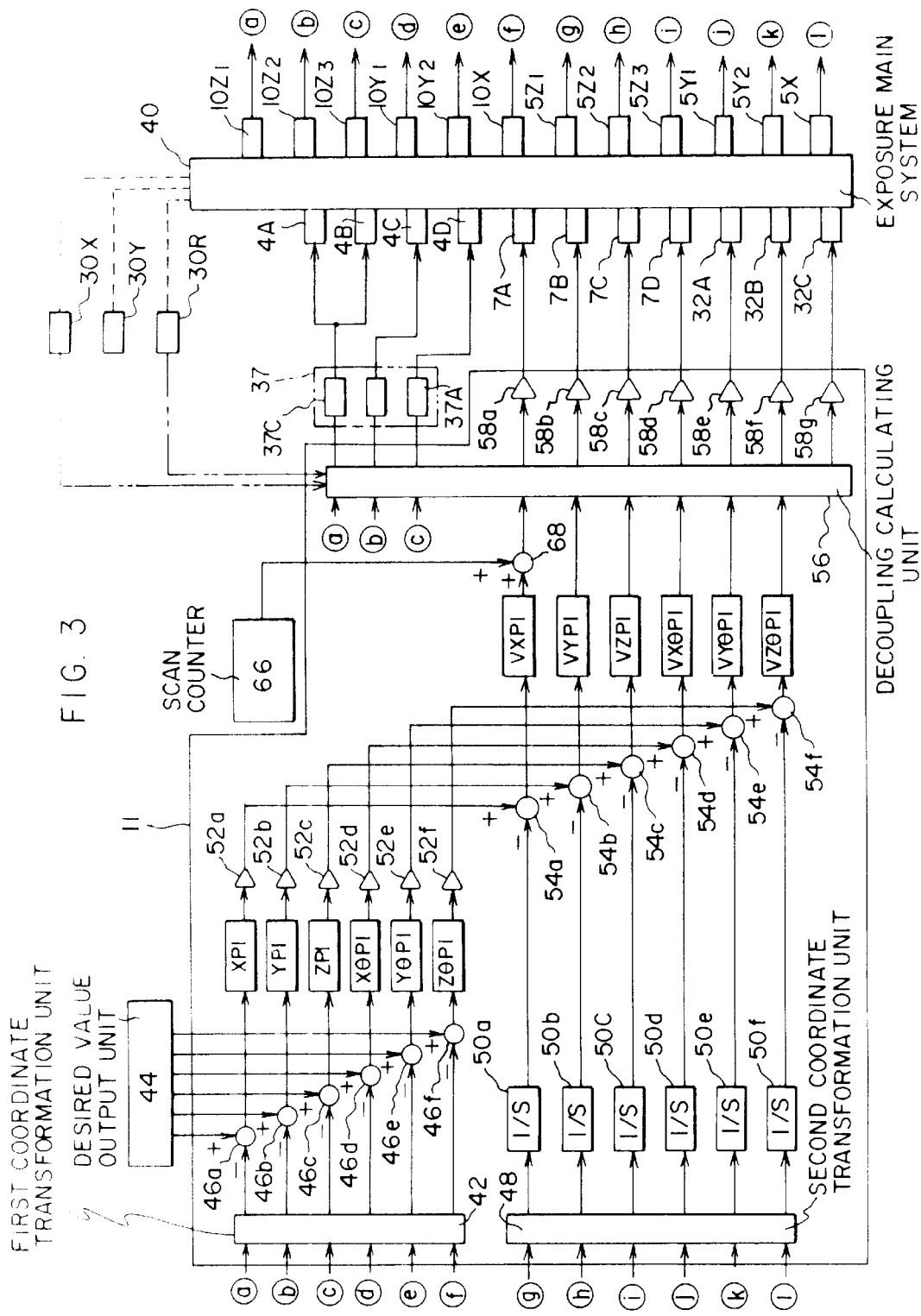
FIG. 3 is a control block diagram showing the arrangement of an actuator and vibration-isolating pad control system according to the first embodiment.

For the other vibration-isolating pads 4B to 4D also, actuators 7B to 7D are installed in parallel to them as in the case of the vibration-isolating pad 4A (the actuators 7C and 7D are not shown in FIG. 1; see FIG. 3). Urging force or attraction force of each of the actuators 7B to 7D is also set by the control unit 11 (not shown in FIG. 1; see FIGS. 2 and 3). The control method for the actuators 7A to 7D will be described later.

As has been stated above, the actuator 7A comprises the stationary member 9A and the moving member 8A. The stationary member 9A is, for example, a magnetic field-generating member having S-pole shafts formed on both sides of an N-pole shaft. The moving member 8A consists essentially of an inner cylinder loosely fitted on the N-pole shaft; a coil wound on the outer periphery of the inner cylinder; and an outer cylinder that covers the coil.

By controlling an electric current flowing through the coil, a force acting in the direction ±Z is generated between the stationary member 9A and the moving member 8A. The other actuators 7B to 7D are arranged as in the case of the actuator 7A.

An XY-stage 20 is mounted on the base plate 6 as a substrate stage driven two-dimensionally in the directions X and Y by a driving device (not shown).

A wafer W as a photosensitive substrate is held by a wafer holder 21 mounted over the XY-stage 20 through a Z-leveling stage (not shown) and a θ stage (not shown). A first column 24 is provided on the base plate 6 so as to surround the XY-stage 20. The projection optical system PL is secured in the center of the top plate of the first column 24. A second column 26 is provided on the top plate of the first column 24 so as to surround the projection optical system PL. A reticle stage 27 is disposed in the center of the top plate of the second column 26. A reticle R, as a mask is mounted on the reticle stage 27.

The position of the XY-stage 20 in the direction Y is measured by a laser interferometer 30Y for the Y-axis, and the position of the XY-stage 20 in the direction X is measured by a laser interferometer 30X for the X-axis (not shown in FIG. 1; see FIG. 3). The outputs of the laser interferometers 30Y and 30X are inputted to both a stage controller (not shown) and a main control unit (not shown). The Z-leveling stage is arranged to be capable of driving in the Z-axis direction and adjusting an inclination with respect to the Z-axis. The θ stage is arranged to be capable of slight rotation about the Z-axis. Accordingly, the wafer W can be positioned three-dimensionally by the XY-stage 20, the Z-leveling stage and the θ stage.

The reticle stage 27 is arranged to be capable of finely adjusting the reticle R in the Y-axis direction and also capable of adjusting the rotational angle of the reticle R. The reticle stage 27 is driven in the direction X by a driving device (not shown). The position of the reticle stage 27 in the direction X is measured by a reticle laser interferometer 30R. The output of the reticle laser interferometer 30R is also inputted to both the stage controller (not shown) and the main control unit (not shown).

An illumination optical system (not shown) is disposed above the reticle R. In the actual process, relative alignment of the reticle R and the wafer W is performed, and autofocus is effected by a focus detecting system (not shown). Then, under illuminating light IL for exposure from the illumination optical system, an image of a pattern on the reticle R is sequentially projected onto shot areas on the wafer W through the projection optical system PL. In this embodiment, to carry out exposure for each shot area on the wafer W, the XY-stage 20 and the reticle stage 27 are moved synchronously with a predetermined speed ratio relative to the illuminating light IL along the X-axis direction (scanning direction) through respective driving devices.

The first column 24 has four leg portions 24a to 24d (the leg portion 24d is not shown in FIG. 1) which are placed in contact with the surface of the base plate 6. Acceleration sensors 5Z1, 5Z2, 5Y1 and 5Y2 are provided on an end portion in the direction +Y of the upper surface of the top plate of the first column 24. The acceleration sensors 5Z1 and 5Z2 serve as vibration sensors that detect an acceleration acting on the first column 24 in the direction Z. The acceleration sensors 5Y1 and 5Y2 detect an acceleration acting on the first column 24 in the direction Y. Acceleration sensors 5Z3 and 5X are provided on an end portion in the direction +X of the upper surface of the top plate of the first column 24. The acceleration sensor 5Z3 serves as a vibration sensor that detects an acceleration acting on the first column 24 in the direction Z. The acceleration sensor 5X detects an acceleration acting on the first column 24 in the direction X. As the acceleration sensors 5Z1, 5Z2, 5Z3, 5Y1, 5Y2 and 5X, for example, piezoresistance effect type or electrostatic capacitance type semiconductor acceleration sensors are used. The outputs of the acceleration sensors 5Z1, 5Z2, 5Z3, 5Y1, 5Y2 and 5X are also inputted to the control unit 11 (not shown in FIG. 1; see FIGS. 2 and 3).

A displacement sensor 10A is disposed at a position facing the −X side of the top plate of the first column 24 on the side closer to the +Y end of the first column 24. The displacement sensor 10A is an integrated sensor comprising a displacement sensor 10Z1 for detecting a displacement of the first column 24 in the direction Z and a displacement sensor 10Y1 for detecting a displacement of the first column 24 in the direction Y. A displacement sensor 10B is disposed at a position facing the +X side of the top plate of the first column 24 on the side closer to the +Y end of the first column 24. The displacement sensor 10B is an integrated sensor comprising a displacement sensor 10Z2 for detecting a displacement of the first column 24 in the direction Z and a displacement sensor 10Y2 for detecting a displacement of the first column 24 in the direction Y. A displacement sensor 10C is disposed at a position facing the +X side of the top plate of the first column 24 on the side closer to the −Y end of the first column 24. The displacement sensor 10C is an integrated sensor comprising a displacement sensor 10Z3 for detecting a displacement of the first column 24 in the direction Z and a displacement sensor 10X for detecting a displace-ment of the first column 24 in the direction X.

As the displacement sensors 10Z1, 10Z2, 10Z3, 10Y1, 10Y2 and 10X, for example, electrostatic capacitance type sensors or eddy-current displacement sensors are used. The electrostatic capacitance type sensor detects the distance between the sensor and an object of measurement [in this case, a metal plate (not shown)] in a non-contact manner by making use of the fact that an electrostatic capacitance is inversely proportional to the distance between the sensor electrode and the object of measurement). In the eddy-current displacement sensor, an AC voltage is previously applied to a coil wound on an insulator, and in this state, the insulator is brought close to an object of measurement made of an electrically-conductive material (electrical conductor). Consequently, an eddy current is generated in the electrical conductor by an AC magnetic field produced by the coil, and a magnetic field is produced by the eddy current in an opposite direction to the direction of the magnetic field produced by the current flowing through the coil. These two magnetic fields overlap each other to affect the output of the coil, causing the current flowing through the coil to change in both intensity and phase. The change becomes larger as the object is brought closer to the coil; as the object is placed remoter from the coil, the change becomes smaller. Therefore, the position or displacement of the object is detected by taking out an electric signal from the coil. It is also possible to use PSDs (semiconductor position sensitive devices) as displacement sensors if the arrangement is such that the influence of background light can be blocked.

The outputs of the displacement sensors 10Y1, 10Y2, 10Z1, 10Z2, 10Z3 and 10X are also supplied to the control unit 11 (not shown in FIG. 1; see FIG. 3).

An actuator 32A is mounted on the +X side of the first column 24 to lie between the first column 24 and a gate-shaped support 35A secured to the pedestal 2. The actuator 32A comprises a stationary member 34A fixed on the support 35A and a moving member 33A mounted on the first column 24 as in the case of the above-described actuators 7A to 7C. The actuator 32A is arranged such that a force can be applied to the first column 24 in the direction ±X by controlling the electric current flowing through the coil in the moving member 33A through the control unit 11. Similarly, moving members 33B and 33C are mounted at two positions, respectively, on the upper surface of the first column 24. Stationary members 34B and 34C are fixed on supports 35A and 35B, respectively, which are secured to the pedestal 2. The stationary members 34B and 34C constitute actuators 32B and 32C in combination with the moving members 33B and 33C, respectively. In the actuators 32B and 32C also, a force can be applied to the first column 24 in the direction ±Y by controlling the electric currents flowing through the coils in the moving members 33B and 33C through the control unit 11. The control method for the actuators 32A to 32C by the control unit 11 will also be described later.

The adjustment of the height and horizontal level of the base plate 6, which is carried out during the installation of the exposure apparatus 100, will be described below with reference to FIG. 2.

A displacement in the direction Z (i.e. height) of the base plate 6 measured by the displacement sensors 10Z1, 10Z2 and 10Z3 is transmitted to the control unit 11. On the basis of these data items, the control unit 11 controls the flow rate of air supplied to each of the vibration-isolating pads 4A to 4D through the three air pressure control circuits 37A to 37C so as to set the height of each of the vibration-isolating pads 4A to 4D in order to match the base plate 6 with a preset height and in order to maintain the horizontal level of the base plate 6.

Thereafter, the heights of the vibration-isolating pads 4A to 4D are maintained at the respective set values. Thus, no distortion occurs in the base plate 6, and the positioning accuracy and so forth of the XY-stage 20 on the base plate 6 are maintained at high levels.

In the exposure apparatus 100 according to this embodiment, an exposure main system (exposure apparatus main body) 40 (see FIG. 3) is constructed of the base plate 6, the XY-stage 20, the wafer holder 21, the first column 24, the projection optical system PL, the second column 26, and the reticle stage 27.

A control system for the actuators 7A to 7D and 32A to 32C and vibration-isolating pads 4A to 4D for vibration isolation of the exposure main system 40 will be described below with reference to the block diagram of FIG. 3. The following description is centered on the control unit 11.

The control unit 11 has a vibration control system as a first control system that controls the actuators 7A, 7B, 7C, 7D, 32A, 32B and 32C so as to suppress vibrations of the exposure main system 40, including the base plate 6, on the basis of the outputs of the displacement sensors 10Z1, 10Z2, 10Z3, 10Y1, 10Y2 and 10X and acceleration sensors 5Z1, 5Z2, 5Z3, 5Y1, 5Y2 and 5X.

More specifically, the vibration control system has a first coordinate transformation unit 42 which is fed with the outputs of the displacement sensors 10Z1, 10Z2, 10Z3, 10Y1, 10Y2 and 10X through respective A/D converters (not shown) and which transform the input data items into displacement quantities (x, y, z, θx, θy, and θz) of the center of gravity G of the exposure main system 40 in the directions of 6 degrees of freedom (X, Y, Z, Xθ, Yθ, and Zθ; see FIG. 1). Six subtracters 46a to 46f subtract the displacement quantities (x, y, z, θx, θy, and θz) in the directions of 6 degrees of freedom of the center of gravity G, which are obtained by the first coordinate transformation unit 42, from respective desired values (x0, y0, z0, θx0, θy0, and θz0) of the center of gravity G in the directions of 6 degrees of freedom, which are inputted from a desired value output unit 44, thereby calculating position deviations (Δx=x0−x, Δy=y0−y, Δz=z0−z, Δθx=θx0−θx, Δθy=θy0−θy, and Δθz=θz0−θz) in the respective directions of 6 degrees of freedom. The vibration control system further has position controllers XPI, YPI, ZPI, XθPI, YθPI and ZθPI for the respective directions of 6 degrees of freedom, which are PI controllers that perform control operations using as actuating signals the position deviations Δx, Δy, Δz, Δθx, Δθy and Δθz in the respective directions of 6 degrees of freedom. A second coordinate transformation unit 48 is fed with the outputs of the acceleration sensors 5Z1, 5Z2, 5Z3, 5Y1, 5Y2 and 5X through respective A/D converters (not shown) and transforms the input data items into accelerations (x", y", z", θx", θy", and θz") in the directions of 6 degrees of freedom of the center of gravity G. Six integrators 50a to 50f integrate the accelerations x", y", z", θx", θy", and θz" in the directions of 6 degrees of freedom of the center of gravity G, which are obtained by the second coordinate transformation unit 48, to convert them into speeds x', y', z', θx', θy' and θz' of the center of gravity G in the respective directions. Speed conversion gains 52a to 52f convert the outputs of the position controllers XPI, YPI, ZPI, XθPI, YθPI and ZθPI into speed command values x0', y0', z0', θx0', θy0', and θz0', respectively. Six subtracters 54a to 54f subtract the outputs x', y', z', θx', θy' and θz' of the integrators 50a to 50f from the speed command values x0', y0', z0', θx0', θy0' and θz0', which are obtained by the speed conversion gains 52a to 52f, thereby calculating speed deviations (Δx'=x0'−x', Δy'=y0'−y', Δz'=z0'−z', Δθx'=θx0'−θx', Δθy'=θy0'−θy', and Δθz'=θz0'−θz') in the respective directions of 6 degrees of freedom. Further, the vibration control system has speed controllers VXPI, VYPI, VZPI, VXθPI, VYθPI and VZθPI for the respective directions of 6 degrees of freedom, which are PI controllers that perform control operations using as actuating signals the speed deviations Δx', Δy', Δz', Δθx', Δθy' and Δθz' in the respective directions of 6 degrees of freedom. A calculating unit 56 performs a decoupling operation for converting each of the speed controlled variables for the directions of 6 degrees of freedom, which are calculated by the speed controllers VXPI, VYPI, VZPI, VXθPI, VYθPI and VZθPI, into a speed command value indicating a speed to be generated at the position of each actuator. Thrust gains 58a to 58g convert the speed command values obtained by the calculating unit 56 into thrusts to be produced by the respective actuators.

In other words, the vibration control system according to this embodiment is a multiloop control system having a position control loop which includes displacement sensors, position controllers, etc., and a speed control system including acceleration sensors, integrators, speed controllers, etc., which is provided inside the position control loop as an internal loop.

In this embodiment, the calculating unit 56 also has the function of calculating and correcting an inclination of the base plate 6, which is caused by the movement of the XY-stage 20 and the reticle stage 27, on the basis of the outputs of the displacement sensors 10Z1, 10Z2 and 10Z3. More specifically, the calculating unit 56 directly monitors the outputs of the displacement sensors 10Z1, 10Z2 and 10Z3 at all times to calculate (detect) an inclination of the base plate 6 and controls the first to third air pressure control circuits 37A to 37C, which constitute an air pressure control unit 37, such that the inclination of the base plate 6 is corrected by the vibration-isolating pads 4A to 4D. Thus, the calculating unit 56 prevents the speed command values for the actuators 7A to 7D obtained by the above-described decoupling calculation from exceeding a predetermined value.

In the exposure apparatus according to this embodiment, the output of a scan counter 66 is supplied as feedforward input data to the vibration control system through an adder 68 provided at the output stage of the speed controller VXPI for the direction X. In the exposure apparatus 100 according to this embodiment, the reticle stage 27 and the XY-stage 20 are synchronously moved in opposite directions to each other along the scanning direction, that is, the X-axis direction, when exposure is carried out for a shot area on the wafer W. At this time, the reticle stage 27 moves across its movable range from one end to the other once per shot at a speed determined by multiplying the speed of the XY-stage 20 by the reciprocal of the demagnification of the projection optical system PL (e.g. the speed of the reticle stage 27 is four or five times the speed of the XY-stage 20). Moreover, because the exposure is carried out during constant-speed movement, the reticle stage 27 performs the following three state transitions: ① acceleration from a stop state to a desired speed; ② maintaining of the desired speed; and ③ deceleration from the desired speed to a stop state. Immediately after the start of the movement of the reticle stage 27 and immediately before the stop of the reticle stage 27, a large reaction acts on the base plate 6 through the second column 26, causing the exposure main system 40, including the base plate 6, to vibrate. Therefore, a command value to produce a reaction-acting counter to the acceleration acting on the reticle stage 27 is supplied from the scan counter 66 to the vibration control system as feedforward input data to suppress vibrations occurring immediately after the start of the movement of the reticle stage 27 and immediately before the stop of the reticle stage 27.

Next, the air pressure control unit 37 for controlling the height of the vibration-isolating pads 4A to 4D will be described with reference to FIG. 4.

The air pressure control unit 37 has first to third air pressure control circuits 37A to 37C connected to an air supply passage 110 through a manually operated valve 101 and also connected to an air discharge passage 120. The manually operated valve 101 is a valve for ON/OFF controlling the supply pressure by a manual operation.

The first air pressure control circuit 37A controls the flow rate of air supplied to the vibration-isolating pad 4D on the left inner side as viewed in the perspective view of FIG. 2. The first air pressure control circuit 37A has a first circuit 38a and a second circuit 38b, which are parallel to each other. The first circuit 38a has a regulator 102A that sets a pressure on the air supply side; a pressure sensor 104A that detects the pressure in the air passage set by the regulator 102A; restrictors for two systems disposed in the air passage where the pressure sensor 104A is provided, i.e. a fine adjustment-side fixed restrictor 106A and a coarse adjustment-side speed controller 105A; a three-port solenoid valve 107A that switches the fixed restrictor 106A and the speed controller 105A from one to the other (i.e. turning ON either of them in an alternative way); and a two-port solenoid valve 108A disposed on a side of the solenoid valve 107A remote from the fixed restrictor 106A to ON/OFF control (open and close) the air passage itself. Similarly, the second circuit 38b has a regulator 102a that sets a pressure on the air discharge side; a pressure sensor 104a that detects the pressure in the air passage set by the regulator 102a; restrictors for two systems disposed in the air passage where the pressure sensor 104a is provided, i.e. a fine adjustment-side fixed restrictor 106a and a coarse adjustment-side speed controller 105a; a three-port solenoid valve 107a that switches the fixed restrictor 106a and the speed controller 105a from one to the other; and a two-port solenoid valve 108a disposed on a side of the solenoid valve 107a remote from the fixed restrictor 106a to ON/OFF control (open and close) the air passage itself. A pressure sensor 103A for detecting the supply pressure in the first air pressure control circuit 37A is provided at the confluence of the first circuit 38a and the second circuit 38b.

The fixed restrictors 106A and 106a are each made of a rigid material, e.g. a stainless steel or ruby, which is provided with a very small hole by laser beam machining, or the like. The hole diameter is in the range of from about 50 micrometers to about 300 micrometers. However, it is also possible to use variable restrictors, such as precision needle valves, in place of the fixed restrictors 106A and 106a. (The same is the case with the following second and third air pressure control circuits.)

The flow rate of air supplied to, or discharged from, the vibration-isolating pad 4D is determined by the effective sectional area of each restrictor, the ratio of the pressure in the first circuit (air supply-side circuit) 38a to the pressure in the first air pressure control circuit 37A, and the ratio of the pressure in the second circuit (air discharge-side circuit) 38b to the pressure in the first air pressure control circuit 37A. Therefore, the flow rate can be set as desired by setting a pressure through the regulators 102A and 102a and switching the fine adjustment-side fixed restrictors 106A and 106a and the coarse adjustment-side speed controllers 105A and 105a.

The second air pressure control circuit 37B has an arrangement similar to that of the first air pressure control circuit 37A. That is, the second air pressure control circuit 37B has a third circuit 39a and a fourth circuit 39b, which are parallel to each other. The third circuit 39a has a regulator 102B, a pressure sensor 104B, a fine adjustment-side fixed restrictor 106B, a coarse adjustment-side speed controller 105B, a three-port solenoid valve 107B, and a two-port solenoid valve 108B. The fourth circuit 39b has a regulator 102b, a pressure sensor 104b, a fine adjustment-side fixed restrictor 106b, a coarse adjustment-side speed controller 105b, a three-port solenoid valve 107b, and a two-port solenoid valve 108b. A pressure sensor 103B for detecting the supply pressure in the second air pressure control circuit 37B is provided at the confluence of the third circuit 39a and the fourth circuit 39b.

The third air pressure control circuit 37C has an arrangement similar to that of the first air pressure control circuit 37A. That is, the third air pressure control circuit 37C has a fifth circuit 40a and a sixth circuit 40b, which are parallel to each other. The fifth circuit 40a has a regulator 102C, a pressure sensor 104C, a fine adjustment-side fixed restrictor 106C, a coarse adjustment-side speed controller 105C, a three-port solenoid valve 107C, and a two-port solenoid valve 108C. The sixth circuit 40b has a regulator 102c, a pressure sensor 104c, a fine adjustment-side fixed restrictor 106c, a coarse adjustment-side speed controller 105c, a three-port solenoid valve 107c, and a two-port solenoid valve 108c. A pressure sensor 103C for detecting the supply pressure in the third air pressure control circuit 37C is provided at the confluence of the fifth circuit 40a and the sixth circuit 40b.

In the second and third air pressure control circuits 37B and 37C also, the flow rate of air can be set as desired by setting a pressure through the regulators and switching the restrictors and the speed controllers as in the case of the first air pressure control circuit 37A.

Figure 4:
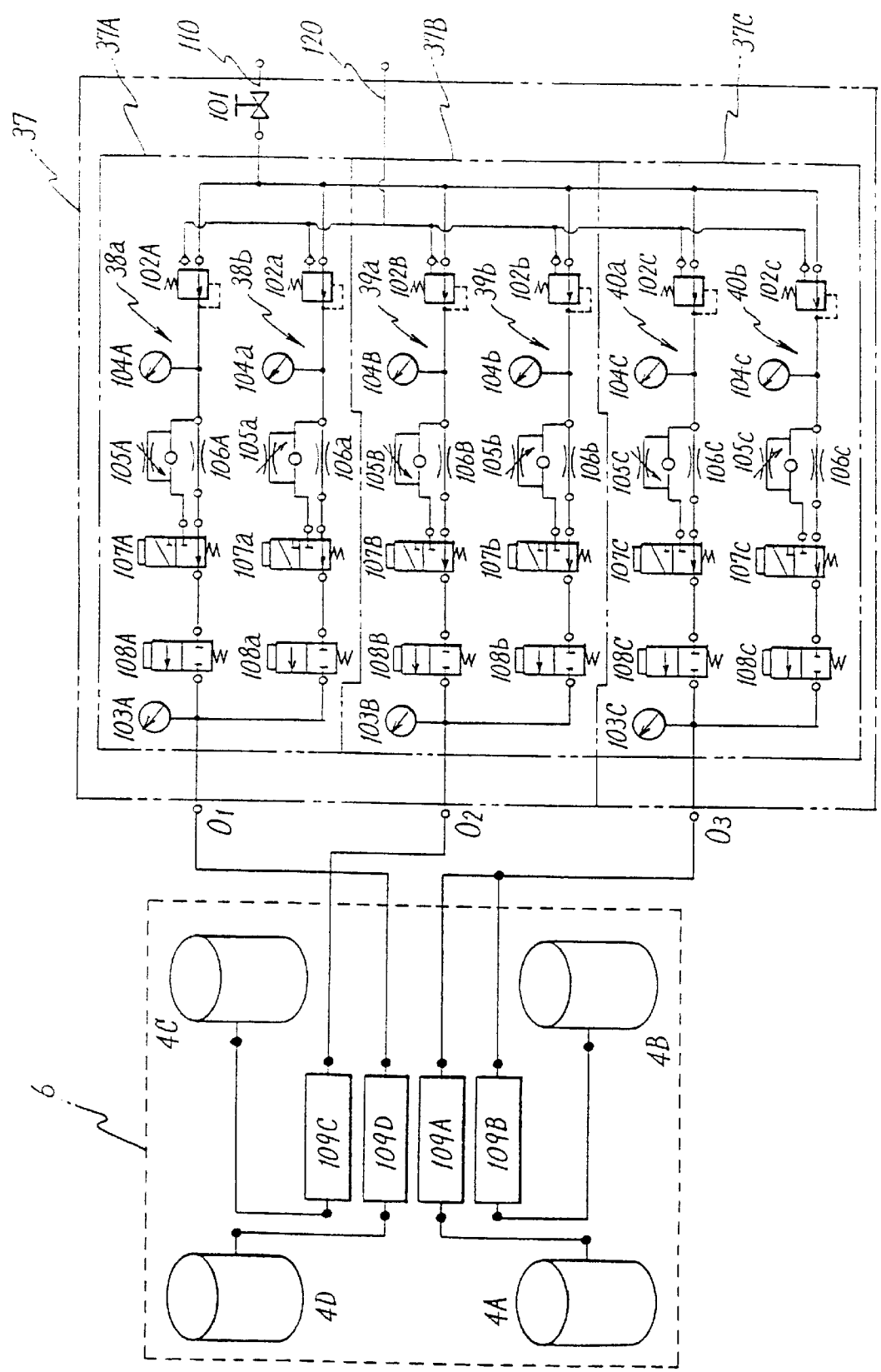
FIG. 4 shows an example of the arrangement of air pressure control circuits for controlling the flow rate of air supplied to the vibration-isolating pads according to the present invention.
Figure 5A:
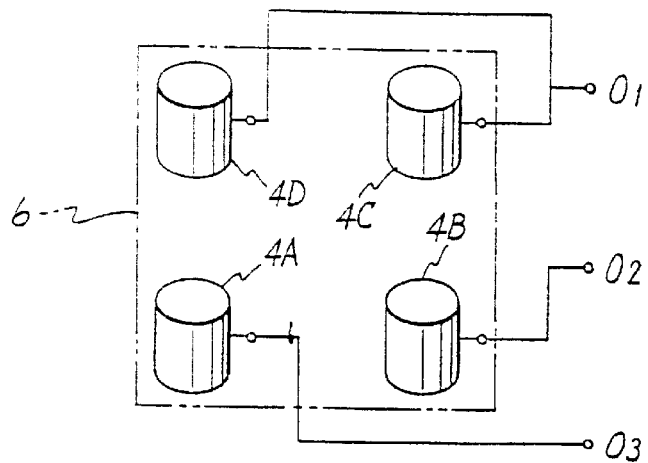
FIGS. 5(A), 5(B) and 5(C) show examples of a method of connecting the air pressure control circuit to the vibration-isolating pads.
Figure 5B:
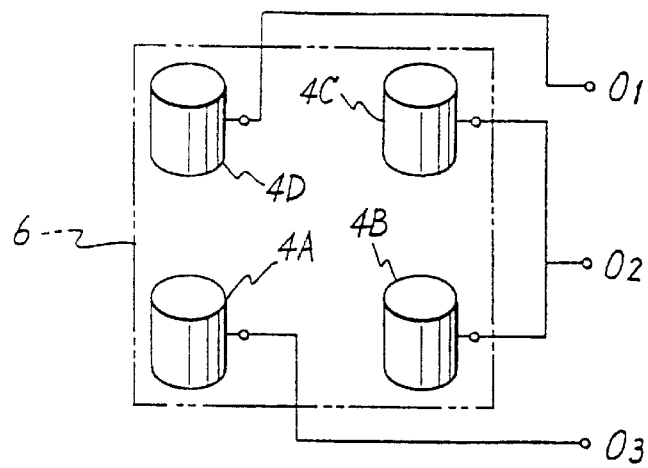
Figure 5C:
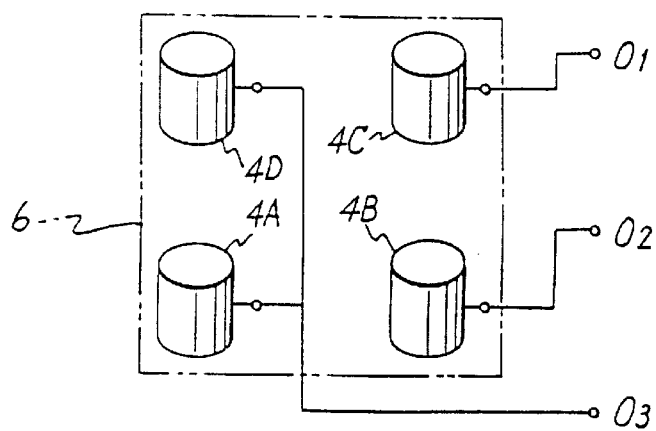

FIG. 4 shows an example in which the lower two vibration-isolating pads 4A and 4B (as viewed in the figure) of the four vibration-isolating pads are controlled by the same air pressure system. However, the air pressure control unit 37 has three systems for supplying air to the vibration-isolating pads 4A to 4D, and the method of connecting the air pressure control circuits of the three systems to the vibration-isolating pads 4A to 4D (i.e. the combination of the air pressure control circuits and the vibration-isolating pads) can be modified in various ways as shown in FIGS. 5(A), 5(B) and 5(C). Therefore, the controllability for the amount of inclination of the exposure main system 40 can be optimized by selecting one of these connecting methods according to the center of gravity of the exposure main system 40 and the arrangement of the vibration-isolating pads 4A to 4D.

The pressure in each of the vibration-isolating pads 4A to 4D, which support the exposure main system 40, is determined by the weight and gravity center of the exposure main system 40 and the arrangement of the vibration-isolating pads 4A to 4D. When the exposure main system 40 lies at the set height and level (horizontal level), the pressures required for the vibration-isolating pads 4A to 4D can be monitored by the pressure sensors 103A, 103B and 103C.

Next, the method of controlling the flow rate of air supplied to the vibration-isolating pads will be described.

Let us assume that the fixed restrictors 106A, 106B, 106C, 106a, 106b and 106c have been selected on the basis of the pressures required for the vibration-isolating pads 4A to 4D, which are determined according to the weight and gravity center of the exposure main system 40 and the arrangement of the vibration-isolating pads 4A to 4D.

The regulators 102A, 102B, 102C, 102a, 102b and 102c are adjusted according to desired supply pressures applied to the respective vibration-isolating pads. To perform this adjustment, flow rate measurement may be carried out. In this embodiment, however, the rate of change in height of each of the vibration-isolating pads 4A to 4D is obtained on the basis of the outputs of the displacement sensors 10Z1, 10Z2 and 10Z3 because in this embodiment a position control loop for correcting the whole or a part of the inclination of the base plate 6 is constructed of the displacement sensors 10Z1, 10Z2 and 10Z3, the decoupling calculating unit 56 in the control unit 11, the air pressure control unit 37, and the vibration-isolating pads 4A to 4D. It should be noted that to adjust the regulators 102A, 102B, 102C, 102a, 102b and 102c, it is preferable to use the values of pressure monitored by the pressure sensors 104A, 104B, 104C, 104a, 104b and 104c as measures for the adjustment.

Next, the speed controllers 105A, 105B, 105C, 105a, 105b and 105c are adjusted to determine each flow rate on the coarse adjustment side.

According to the air pressure control unit 37 arranged as described above, the flow rate of air supplied to the vibration-isolating pads 4A to 4D is controlled by selectively using two systems, i.e. coarse and fine adjustment systems. This enables the gain of the position control loop for the base plate 6 as an anti-vibration bed to be set in any one of two different kinds of state, i.e. a high gain and a low gain.

Figure 6A:
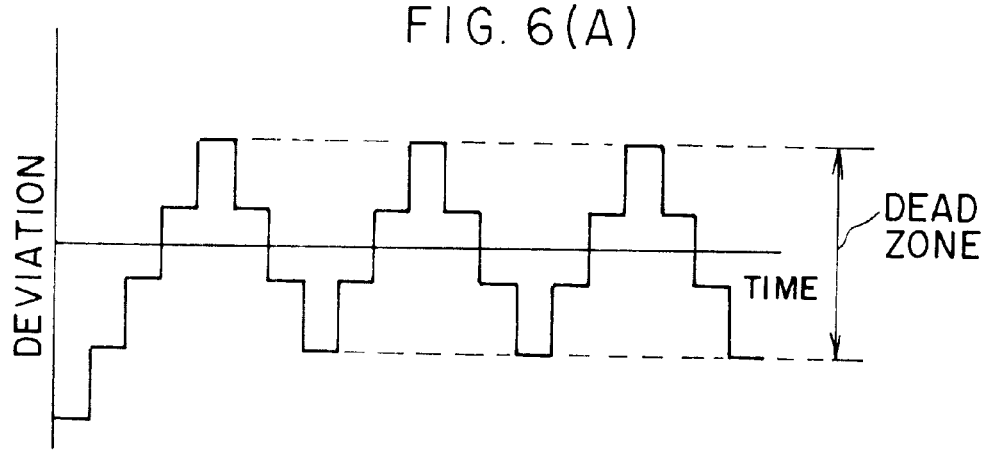
Figure 6B:
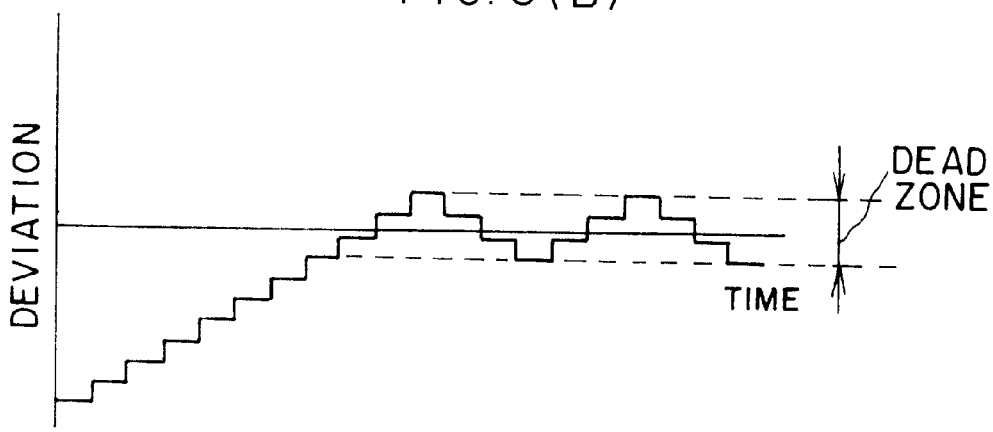

FIG. 6(A) shows an example in which the position control is effected by using only a high gain. FIG. 6(B) shows an example in which the position control is effected by using only a low gain. In the former case, the period of time required for the vibration-isolating pad height to reach a desired position is relatively short. However, the convergence is inferior, and the dead zone is undesirably large. In the latter case, the period of time required for the vibration-isolating pad height to reach a desired position is relatively long, but the convergence is superior, and the dead zone is favorably small.

Figure 6C:
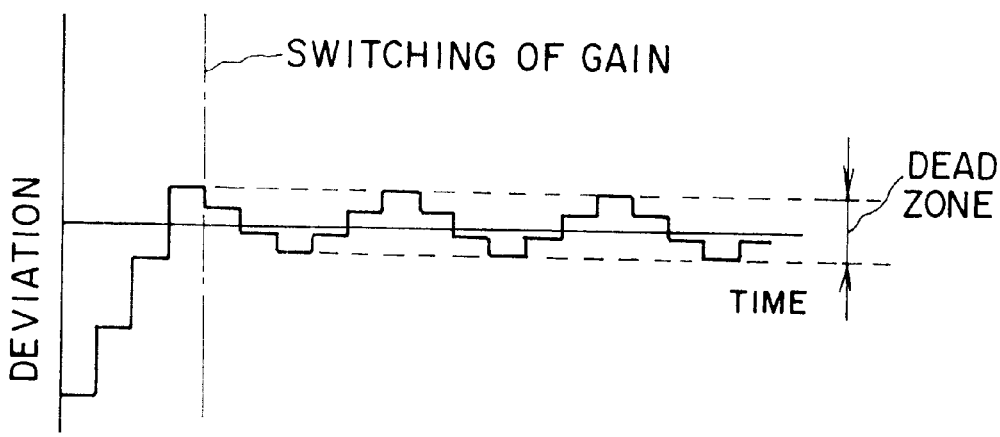

FIG. 6(C) shows a time response example in a case where gains are switched over from a high gain to a low gain by using the air pressure control circuits 37A to 37C according to this embodiment. As will be clear from a comparison of FIG. 6(C) with FIGS. 6(A) and 6(B), it is possible in the case of FIG. 6(C) to reduce the dead zone without sacrificing the time response in the position control.

The scan exposure operation of the exposure apparatus 100, arranged as described above, will be described below.

When the XY-stage 20 and the reticle stage 27 are moved along the X-axis direction to carry out scan exposure, the center of gravity of the exposure main system 40 shifts. As a result, the exposure main system 40, including the base plate 6, is inclined. The outputs of the displacement sensors 10Z1, 10Z2 and 10Z3 at this time are supplied to the calculating unit 56, which constitutes the control unit 11. The outputs of the displacement sensors 10ZI, 10Z2, 10Z3, 10Y1, 10Y2 and 10X and acceleration sensors 5Z1, 5Z2, 5Z3, 5Y1, 5Y2 and 5X are also supplied to the vibration control system of the control unit 11.

The calculating unit 56 calculates the amount of inclination of the base plate 6 on the basis of the outputs of the displacement sensors 10Z1, 10Z2 and 10Z3 and controls the flow rate of air supplied to the vibration-isolating pads 4A to 4D such that the inclination is corrected. At this time, the calculating unit 56 performs the above-described gain switching operation to increase the height control responsivity of the vibration-isolating pads 4A to 4D and to reduce the dead zone, thereby ensuring adequate convergence. When the amount of inclination of the base plate 6 is large, e.g. when the XY-stage 20 and the reticle stage 27 start to move, the gain is set at a high value to obtain high responsivity, thereby rapidly restoring the vibration-isolating pad height to a level near the set (desired) position. When the amount of inclination of the base plate 6 is small, e.g. when the XY-stage 20 and the reticle stage 27 move at constant speed, the gain is set at a low value to reduce the dead zone. Thus, an optimum gain is set according to the amount of inclination of the base plate 6 (i.e. the size of position controlled variable), thereby enabling vibrations of the base plate 6 to be efficiently suppressed.

Thus, the greater part (or the whole) of inclination of the exposure main system 40, including the base plate 6, can be rapidly corrected by the vibration-isolating pads 4A to 4D. Vibrations due to the shift of the gravity center of the exposure main system 40, which is caused by the movement of the stages 20 and 27, are effectively suppressed by controlling the actuators 7A, 7B, 7C, 7D, 32A, 32B and 32C through the control unit 11 on the basis of the outputs of the displacement sensors 10Z1, 10Z2, 10Z3, 10Y1, 10Y2 and 10X and acceleration sensors 5Z1, 5Z2, 5Z3, 5Y1, 5Y2 and 5X. The remaining inclination of the exposure main system 40, including the base plate 6, is corrected by the actuators 7A, 7B, 7C and 7D.

Accordingly, vibrations of the exposure main system 40, including the base plate 6, are effectively suppressed without being substantially affected by the influence of shift of the gravity center of the exposure main system 40 caused by the movement of the stages 20 and 27. Moreover, the greater part of the inclination of the anti-vibration bed is corrected by controlling the flow rate of air supplied to the vibration-isolating pads. Therefore, the thrust required for the actuators 7A, 7B, 7C and 7D is reduced in comparison to a case where the inclination of the exposure main system 40 as well as vibrations thereof is corrected by only the actuators 7A, 7B, 7C and 7D. Thus, it is possible to minimize the electric current flowing through the coils of the moving members of the actuators 7A, 7B, 7C and 7D and hence possible to markedly reduce the amount of heat generated therefrom. Accordingly, it is possible to suppress changes in the temperature of an environment where the exposure apparatus 100 is installed.

Moreover, vibrations of the exposure main system 40, which are generated immediately after the start of movement of the reticle stage 27 and immediately before the stop of the reticle stage 27 during scan exposure, are suppressed by the feedforward entry of a command value from the scan counter 66.

To minimize the thrust to be generated by the actuators 7A, 7B, 7C and 7D, it is desirable for the calculating unit 56 to correct the inclination of the base plate 6 and to remove low-frequency components of vibrations applied to the base plate 6 by controlling the flow rate of air supplied to the vibration-isolating pads 4A to 4D through the air pressure control circuits 37A to 37C, which constitute the air pressure control unit 37. In this case, the vibration control system effects such control that only high-frequency components of the vibrations applied to the base plate 6 are removed by using the actuators 7A to 7D.

As will be clear from the foregoing description, according to the first embodiment the second control system comprises the displacement sensors 10Z1, 10Z2 and 10Z3, the calculating unit 56, and the air pressure control circuits 37A to 37C.

As has been described above, in the exposure apparatus 100 according to the first embodiment, an inclination of the base plate 6 caused by the shift of the gravity center when the stages 20 and 27 move is detected by the calculating unit 56 in the control unit 11 on the basis of the outputs of the displacement sensors 10Z1, 10Z2 and 10Z3, and the calculating unit 56 controls the flow rate of air supplied to the vibration-isolating pads 4A to 4DC through the air pressure control circuits 37A to 37C such that the greater part (or the whole) of the inclination of the base plate 6 is rapidly corrected. At this time, the calculating unit 56 performs the above-described gain switching operation [as shown in FIG. 6(C)] to increase the height control responsivity of the vibration-isolating pads 4A to 4D and to reduce the dead zone, thereby ensuring adequate convergence.

Accordingly, it is possible to reduce the thrust required for each actuator in comparison to a case where, not only vibrations, but also an inclination of the exposure main system 40, including the base plate 6, is corrected by only the actuators. As a result, the amount of heat generated from each actuator is reduced, and this makes it possible to reduce changes in the temperature of an environment where the exposure main system 40 is installed. Thus, it is possible to prevent degradation of the measuring accuracy of the laser interferometers 30X and 30Y in particular, which are used to measure the position of the XY-stage 20, and hence possible to improve the stage-positioning accuracy.

In the exposure apparatus 100 according to this embodiment, it is easy to make uniform the rate of change of the height of each vibration-isolating pad, and thus the vibration controllability improves.

In the above case, it is possible to predict an amount of inclination of the base plate 6 due to the shift of the gravity center of the exposure main system 40, which is caused by the movement of the stages 20 and 27, on the basis of the amounts of displacement (positions) of the stages 20 and 27 measured by the laser interferometers 30X and 30R.

For example, the calculating unit 56, which constitutes the second control system, is supplied with the outputs of the laser interferometers 30X and 30R, as shown by the chain double-dashed line arrows in FIG. 3. Thus, it is possible for the calculating unit 56 to predict an amount of inclination of the base plate 6 due to the shift of the gravity center of the exposure main system 40, which is caused by the movement of the stages 20 and 27, on the basis of the outputs of the laser interferometers 30X and 30R and to feedforward-control the vibration-isolating pads 4A to 4D and the actuators 7A, 7B, 7C and 7D so as to cancel the effect of the inclination by using such a command value as to correct the inclination. In this case, it is possible to prevent the occurrence of an inclination of the base plate 6 which would otherwise be corrected after it has actually occurred. Therefore, the thrust required for the actuators 7A, 7B, 7C and 7D can be further reduced, and the amount of heat generated from the actuators 7A, 7B, 7C and 7D can be further reduced.

It should be noted that to maintain the amount of heat generated from the actuators 7A, 7B, 7C and 7D at a constant value, it is preferable to provide a control circuit that maintains, at a constant value, the thrust generated by the actuators 7A, 7B, 7C and 7D or the electric current flowing through each of the actuators 7A, 7B, 7C and 7D at the time of correcting the inclination of the exposure main system 40, including the base plate 6, and damping vibrations of the exposure main system 40.

More specifically, the above control circuit can be realized by providing a coil serving as a heating element separately from the coils wound on the moving members of the actuators 7A, 7B, 7C and 7D and controlling the sum of electric currents flowing through the coil as a heating element and the other coils such that the total amount of heat generated is maintained at a constant value. In this case, it is possible to effectively suppress changes in the temperature of an environment where the exposure main system 40 is installed.

Second Embodiment:

Next, a second embodiment of the present invention will be described with reference to FIGS. 7 through 10. In the second embodiment, constituent members or portions that are identical or equivalent to those in the above-described first embodiment are denoted by the same reference characters, and the description thereof is simplified or omitted.

Figure 7:
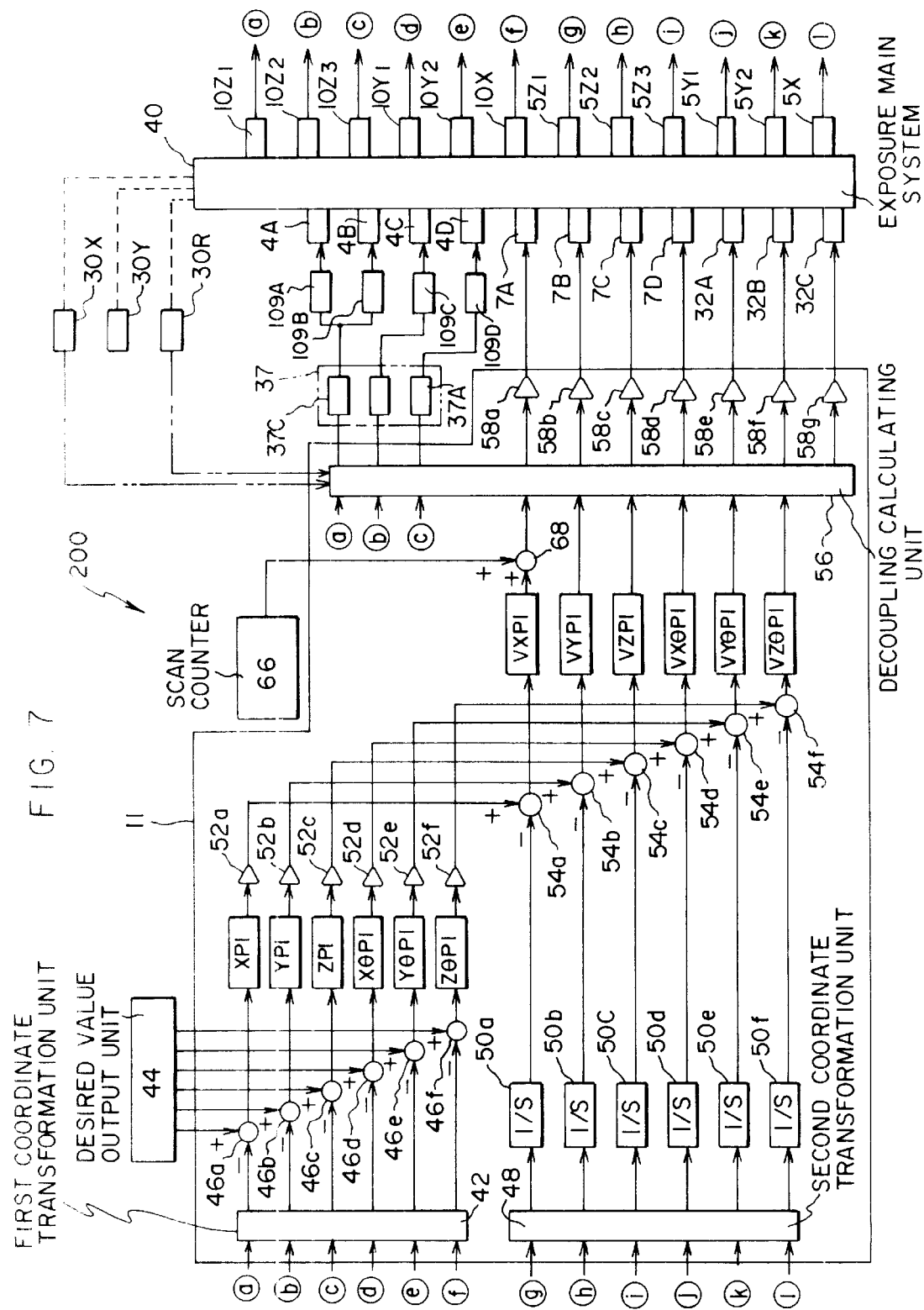
FIG. 7 shows the arrangement of an actuator and vibration-isolating pad control system in an exposure apparatus according to a second embodiment of the present invention, together with an exposure main system.
Figure 8:
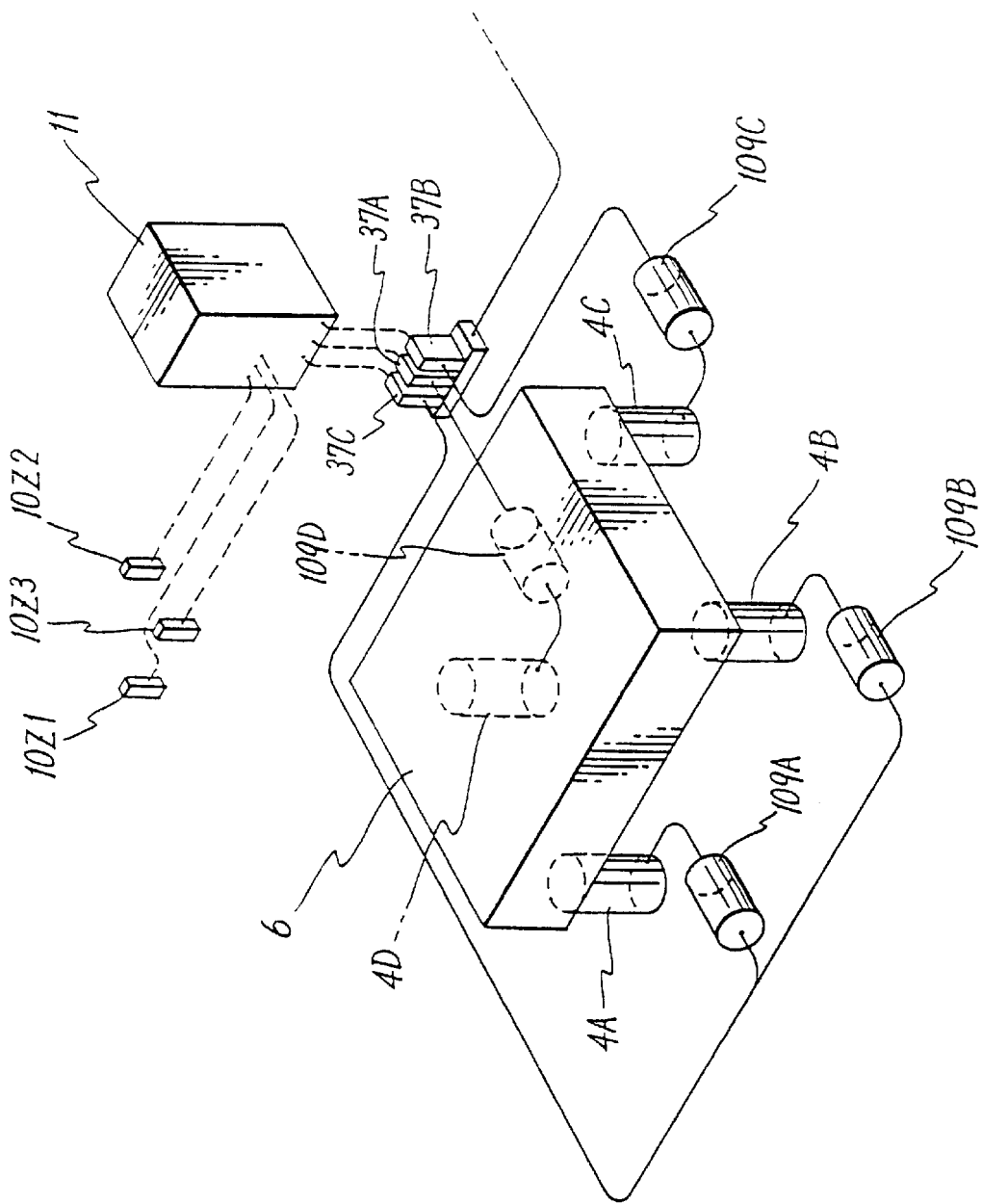
FIG. 8 is a perspective view schematically showing a system for controlling vibration-isolating pads according to the second embodiment.
Figure 9:
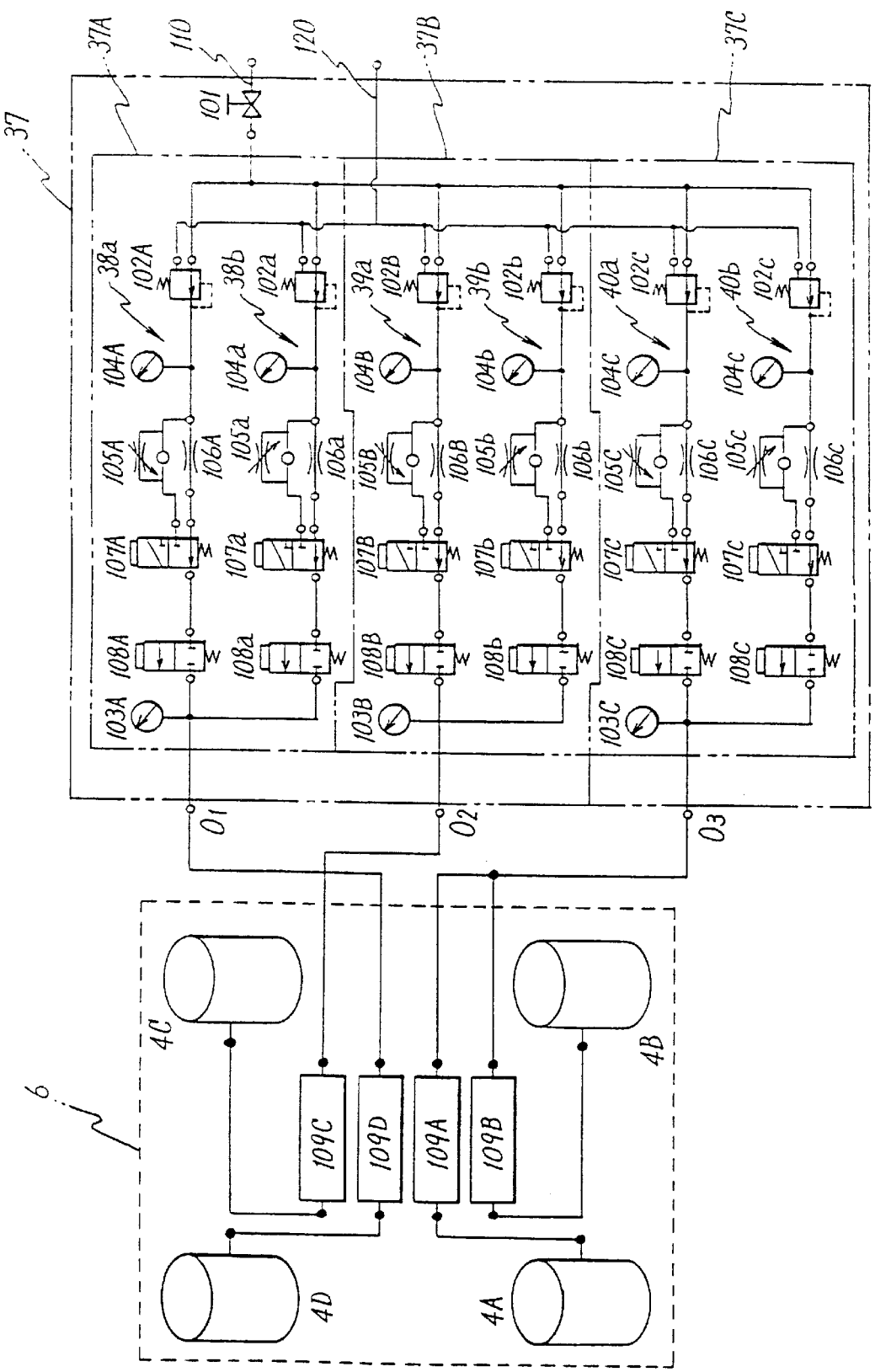
FIG. 9 shows the arrangement of air pressure control circuits for controlling the flow rate of air supplied to the vibration-isolating pads according to the second embodiment, together with the vibration-isolating pads.

FIG. 7 shows the arrangement of a control system for the actuators 7A to 7D, 32A to 32C and vibration-isolating pads 4A to 4D of a step-and-scan type exposure apparatus 200 according to the second embodiment, together with the exposure main system 40. FIG. 8 is a perspective view schematically showing a system for controlling the vibration-isolating pads 4A to 4D of the exposure apparatus 200 according to the second embodiment. FIG. 9 shows the arrangement of an air pressure control unit 37 for controlling the flow rate of air supplied to the vibration-isolating pads 4A to 4D, together with the vibration-isolating pads 4A to 4D.

The exposure apparatus 200 is characterized in that, as shown in FIGS. 7 through 9, buffer tanks 109A and 109B are provided between the air pressure control circuit 37C and the two vibration-isolating pads 4A and 4B which are supplied with, and discharged of, air by the air pressure control circuit 37C, and that a buffer tank 109C is provided between the air pressure control circuit 37B and the vibration-isolating pad 4C which is supplied with, and discharged of, air by the air pressure control circuit 37B, and further that a buffer tank 109D is provided between the air pressure control circuit 37A and the vibration-isolating pad 4D which is supplied with, and discharged of, air by the air pressure control circuit 37A.

The arrangements of the other portions are the same as those in the above-described first embodiment.

The exposure apparatus 200 according to the second embodiment provides advantageous effects equivalent to those of the exposure apparatus 100 according to the first embodiment and further provides the following advantageous effects:

Regardless of whether the gain of the position control loop is high or low, when the flow rates of air supplied to the vibration-isolating pads 4A to 4D are controlled by using the air pressure control circuits 37A to 37C, the solenoid valves 108A to 108C and 108a to 108c, which open and close (ON/OFF control) the first circuit 38a to the sixth circuit 40b, are ON/OFF controlled. Consequently, the pressure in the vibration-isolating pads 4A to 4D changes rapidly (i.e. pulsation occurs), causing a hop or other similar undesired phenomenon to occur on the XY-stage 20 and so forth, which are mounted on the base plate 6 supported by the vibration-isolating pads 4A to 4D.

Figure 10A:
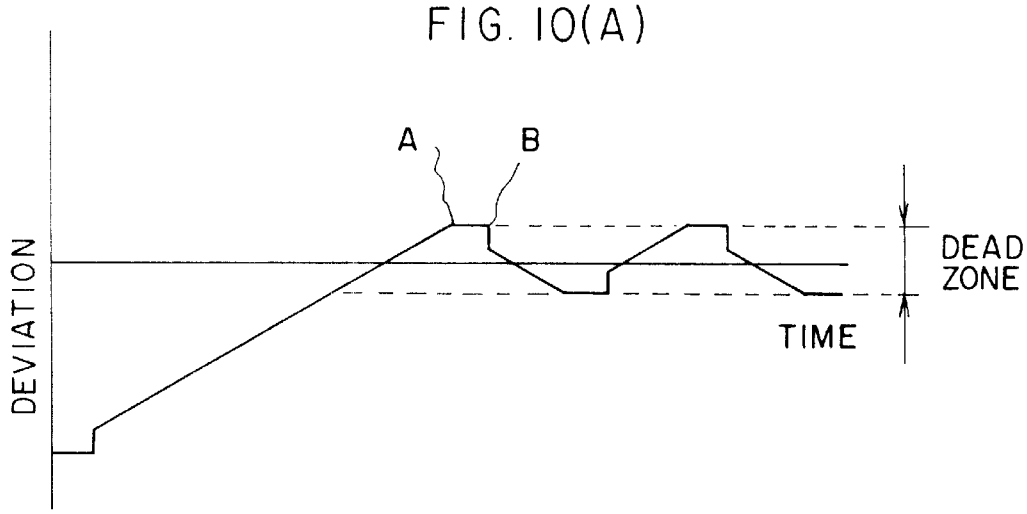

FIG. 10(A) shows an example of time response in the first embodiment. FIG. 10(A) shows time response in a case where control is effected such that the solenoid valves 108A to 108C and 108a to 108c are kept ON (or OFF) for a predetermined period of time and thereafter turned OFF (or ON). It will be understood from the figure that the deviation changes rapidly at the points A and B.

In the second embodiment, the buffer tanks 109A to 109D are provided between the air pressure control circuits 37A to 37C and the vibration-isolating pads 4A to 4D. Therefore, regardless of whether the gain of the position control loop is high or low, the pressure in the vibration-isolating pads 4A to 4D can be prevented from rapidly changing even when the solenoid valves 108A to 108C are ON/OFF controlled to control the flow rate of air supplied to the vibration-isolating pads 4A to 4D by using the air pressure control circuits 37A to 37C. Accordingly, it becomes unlikely that a hop or other similar undesired phenomenon will occur on the XY-stage 20 and so forth, which are mounted on the base plate 6 supported by the vibration-isolating pads 4A to 4D.

Figure 10B:
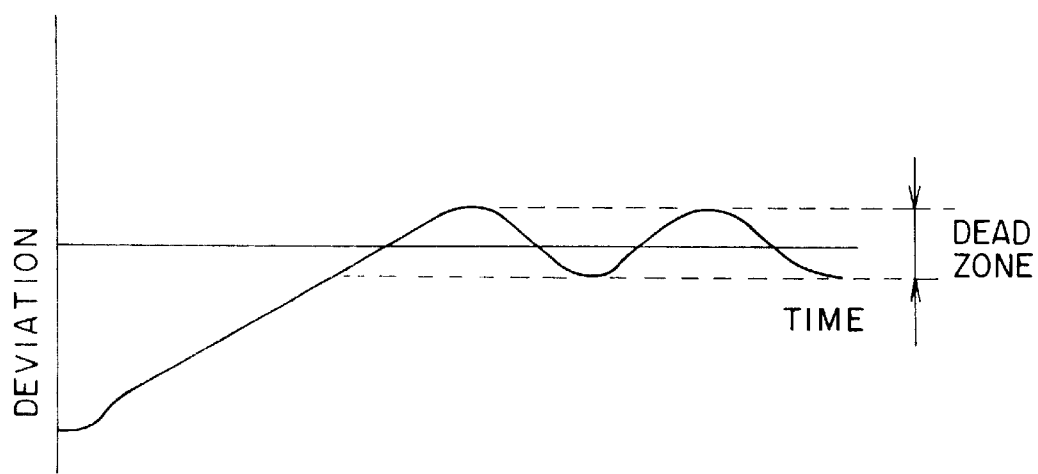

FIG. 10(B) shows an example of time response in the second embodiment in a case where the same flow rate control as in FIG. 10(A) is carried out. It will be clearly understood by a comparison of FIG. 10(B) with FIG. 10(A) that the change of the error is gentler in the second embodiment than in the first embodiment.

It should be noted that in the first and second embodiments each air pressure control circuit has an air supply-side circuit and an air discharge-side circuit, each having an orifice (e.g. a fixed restrictor) with a very small diameter which is disposed in an air passage; a regulator that sets a pressure in the air passage; and a solenoid valve that opens and closes the air passage. With the air pressure control circuit, the flow rate is set at a given value in each of the air supply- and discharge-side circuits by the combination of the orifice with a very small diameter and the regulator, and air is supplied and discharged by ON/OFF controlling each solenoid valve. In this case, because each circuit has an orifice with a very small diameter, it is possible to effect such control that the corresponding vibration-isolating pad is caused to produce a very small amount of displacement by reducing the set flow rate.

Although in the foregoing first and second embodiments the anti-vibration apparatus according to the present invention is applied to a step-and-scan type projection exposure apparatus, the anti-vibration apparatus according to the present invention can also be suitably applied to a step-and-repeat type projection exposure apparatus, e.g. stepper, because in such a projection exposure apparatus also a stage moves over a base plate. In the case of a stepper, because it is a one-shot exposure type apparatus, the stage is stationary during exposure; therefore, no scan counter is needed.

Although in the foregoing first and second embodiments, seven actuators and four vibration-isolating pads are used to suppress vibrations of the exposure main system 40 in the directions of six degrees of freedom, it should be noted that the present invention is not necessarily limited thereto, and that the present invention may be applied to any apparatus arranged to be capable of correcting an inclination of a base plate (anti-vibration bed). It is desirable that there-should be at least three actuators for the direction Z, and that there should be at least three vibration-isolating pads.

As has been described above, it is possible to minimize the influence on the environmental temperature without being substantially affected by the influence of the shift of the gravity center of the main body due to the stage movement and without reducing the disturbance vibration suppressing (damping) effect.

It becomes possible to maintain the amount of heat generated from the actuators at a constant value, and it is possible to minimize the influence on the environmental temperature.

It is also possible to prevent a rapid change of the pressure in the vibration-isolating pads.

It is possible to suppress heat generation from the actuators without impairing the desired vibration-isolating performance. Moreover, it is possible to suppress or prevent the change of the pressure in the vibration-isolating pads.

The exposure accuracy can be improved by the vibration-isolating effect of the anti-vibration apparatus.

It should be noted that the entire disclosure of Japanese Patent Application No. 8-110280 filed in Japan on Apr. 5, 1996 (including specification, claims, drawings and summary) is incorporated herein by reference in its entirety.

What is claimed is:

1. An anti-vibration apparatus comprising:
    an anti-vibration bed held horizontally through at least three pneumatic vibration-isolating pads;
    a plurality of actuators that drive said anti-vibration bed vertically at different positions, said actuator comprising a magnetic member and a coil member and generating force by interacting current flowing in said coil member and a magnetic field of said magnetic member;
    a displacement sensor that detects a displacement of said anti-vibration bed;
    a vibration sensor that detects vibrations of said anti-vibration bed;
    a first control system that controls said force generated by each of said actuators and removes high-frequency components of the vibration of said anti-vibration bed on a basis of at least one of an output of said displacement sensor and an output of said vibration sensor; and
    a second control system that controls a flow rate of air supplied to said vibration-isolating pads according to an amount of inclination of said anti-vibration bed and removes low-frequency components of the vibration of said anti-vibration bed.

2. An anti-vibration apparatus according to claim 1, wherein said second control system is a loop control system that controls the flow rate of air supplied to said vibration-isolating pads on a basis of a result of detection obtained by said displacement sensor, and changes a gain of said loop control according to the amount of inclination of said anti-vibration bed.

3. An anti-vibration apparatus according to claim 1, further comprising:
    a control circuit that maintains, at a constant value, one of a thrust to be generated from each of said actuators and an electric current flowing through each of said actuators when an inclination of said anti-vibration bed is corrected and when the vibrations of said anti-vibration bed are suppressed.

4. An anti-vibration apparatus comprising:
    an anti-vibration bed held horizontally through at least three pneumatic vibration-isolating pads;
    a plurality of actuators that drive said anti-vibration bed vertically at different positions, said actuator comprising a magnetic member and a coil member and generating force by interacting current flowing in said coil member and a magnetic field of said magnetic member;
    a displacement sensor that detects a displacement of said anti-vibration bed;
    a vibration sensor that detects vibrations of said anti-vibration bed;
    a first control system that controls said force generated by each of said actuators and removes high-frequency components of the vibration of said anti-vibration bed on a basis of at least one of an output of said displacement sensor and an output of said vibration sensor;
    a second control system having an air controller for controlling a flow rate of air supplied to each of said vibration-isolating pads, thereby correcting an inclination of said anti-vibration bed and removing low-frequency components of the vibration of said anti-vibration bed; and
    a buffer tank provided between each of said vibration-isolating pads and said air controller.

5. An anti-vibration apparatus according to claim 4, wherein said air controller has an air supply-side circuit and an air discharge-side circuit,
    said air supply-side circuit and air discharge-side circuit each having:
        an orifice with a very small diameter which is disposed in an air passage;
        a regulator that sets a pressure in said air passage; and
        a solenoid valve that opens and closes said air passage.

6. An exposure apparatus comprising:
    an anti-vibration bed held horizontally through at least three pneumatic vibration-isolating pads;
    an exposure system disposed on said anti-vibration bed to transfer a pattern on a mask onto a substrate;
    a plurality of actuators that drive said anti-vibration bed vertically at different positions, said actuator comprising a magnetic member and a coil member and generating force by interacting current flowing in said coil member and a magnetic field of said magnetic member;
    a displacement sensor that detects a displacement of said anti-vibration bed;
    a vibration sensor that detects vibrations of said anti-vibration bed;
    a first control system that controls said force generated by each of said actuators and removes high-frequency components of the vibration of said anti-vibration bed on a basis of at least one of an output of said displacement sensor and an output of said vibration sensor; and
    a second control system that controls a flow rate of air supplied to said vibration-isolating pads according to an amount of inclination of said anti-vibration bed and removes low-frequency components of the vibration of said anti-vibration bed, said inclination being caused by a shift of a center of gravity of said exposure system.

7. An exposure apparatus according to claim 6, wherein said exposure system has a stage that moves with said substrate held thereon, and wherein movement of said stage causes said anti-vibration bed to be inclined.

8. An exposure apparatus according to claim 6, which is a scanning type exposure apparatus that transfers the pattern on said mask onto said substrate by synchronously moving said mask and said substrate.

9. An exposure apparatus according to claim 6, wherein said second control system is a loop control system that controls the flow rate of air supplied to said vibration-isolating pads on a basis of a result of detection obtained by said displacement sensor, and changes a gain of said loop control according to the amount of inclination of said anti-vibration bed.

10. An exposure apparatus according to claim 9, wherein said second control system sets said gain at a high value when the amount of inclination of said anti-vibration bed is large.

11. An exposure apparatus comprising:
    an anti-vibration bed held substantially horizontally through a pneumatic vibration-isolating pad;
    a plurality of actuators that drive said anti-vibration bed vertically at different positions, said actuator comprising a magnetic member and a coil member and generating force by interacting current flowing in said coil member and a magnetic field of said magnetic member;

a stage that holds a substrate onto which a pattern on a mask is to be transferred, said stage being movable over said anti-vibration bed, with said substrate held thereon; and a control system that controls said force generated by each of said actuators and a flow rate of air supplied to said vibration-isolating pad according to a position of said stage, said actuator removing high-frequency components of the vibration of said anti-vibration bed and said vibration-isolating pads removing low-frequency components of the vibration of said anti-vibration bed.

12. An exposure apparatus according to claim 11, further comprising:

a measuring system that measures the position of said stage, wherein said control system feedforward-controls the flow rate of air supplied to said vibration-isolating pad on a basis of a result of measurement obtained by said measuring system.

13. An anti-vibration apparatus comprising:

an anti-vibration bed held horizontally through at least three pneumatic vibration-isolating pads;

a plurality of actuators that drive said anti-vibration bed vertically at different positions;

a displacement sensor that detects a displacement of said anti-vibration bed;

a vibration sensor that detects vibrations of said anti-vibration bed;

a first control system that controls each of said actuators to suppress the vibrations of said anti-vibration bed on a basis of outputs of said displacement sensor and vibration sensor;

a second control system that controls a flow rate of air supplied to said vibration-isolating pads according to an amount of inclination of said anti-vibration bed; and a control circuit that maintains, at a constant value, one of a thrust to be generated from each of said actuators and an electric current flowing through each of said actuators when an inclination of said anti-vibration bed is corrected and when the vibrations of said anti-vibration bed are suppressed.

14. An anti-vibration apparatus comprising:

an anti-vibration bed held horizontally through at least three pneumatic vibration-isolating pads;

a plurality of actuators that drive said anti-vibration bed vertically at different positions;

a displacement sensor that detects a displacement of said anti-vibration bed;

a vibration sensor that detects vibrations of said anti-vibration bed;

a first control system that controls each of said actuators to suppress the vibrations of said anti-vibration bed on a basis of outputs of said displacement sensor and vibration sensor;

a second control system having an air controller for controlling a flow rate of air supplied to each of said vibration-isolating pads, thereby correcting an inclination of said anti-vibration bed; and a buffer tank provided between each of said vibration-isolating pads and said air controller;

wherein said air controller has an air supply-side circuit and an air discharge-side circuit, said air supply-side circuit and air discharge-side circuit each having;

an orifice with a very small diameter which is disposed in an air passage;

a regulator that sets a pressure in said air passage; and a solenoid valve that opens and closes said air passage.

* * * * *